United States Patent [19]

King

[11] 4,305,153

[45] * Dec. 8, 1981

[54] METHOD FOR MEASURING MICROWAVE ELECTROMAGNETIC FIELDS

[75] Inventor: Ray J. King, Madison, Wis.

[73] Assignee: Wisconsin Alumi Research Foundation, Madison, Wis.

[*] Notice: The portion of the term of this patent subsequent to Mar. 25, 1997, has been disclaimed.

[21] Appl. No.: 70,251

[22] Filed: Aug. 27, 1979

Related U.S. Application Data

[63] Continuation of Ser. No. 958,189, Nov. 6, 1978, Pat. No. 4,195,262.

[51] Int. Cl.³ .................... H04B 17/00; G01S 1/44
[52] U.S. Cl. .................... 455/67; 455/115; 343/100 AP; 343/100 PE
[58] Field of Search ............ 455/8, 9, 10, 19, 25, 455/67, 69, 115, 125; 343/18 D, 18 E, 17.7, 100 R, 100 AD, 100 AP, 100 PE, 100 CL, 105 LS, 106 R, 106 P, 112 PT

[56] References Cited

U.S. PATENT DOCUMENTS

| | | | |
|---|---|---|---|
| 3,300,722 | 1/1967 | Keigo Iizuka | 455/67 |
| 4,051,474 | 9/1977 | Mack | 343/100 PE |
| 4,053,892 | 10/1977 | Earp | 343/106 R |

OTHER PUBLICATIONS

A New Perturbation Method for Measuring Microwave Fields In Free Space, by Cullen, Proc. IEE, Fol. 102B, pp. 836–844, 1955.
"Measurement of Time–Quadrature Components of Microwave Signals", IRE., Trans. On Microwave Theory and Techniques, vol. III(2), pp. 13–15 Apr. 1955.
"A Modulated Scatterer Technique for Measurement of Field Distributions", by Richmond, J. H., IRE Trans. on Microwave Theory and Techniques, vol. III(3), pp. 13–15, Jul., 1955.
Direction Sensitive Doppler Device, by Kalmus, H. P., Proc. IRE vol. 43(6), pp. 698–700, Jun. 1955.
Short–Range Radio–Telemetry for Electronic Identification, Using Modulated RF Backscatter, by Koelle, A. R., et al., Orig, IEE, pp. 1260–1261, Aug. 1975.
Doppler Radar with Cooperative Target Measures to Zero Velocity and Senses the Direction of Motion, by Koelle, A. R. et al., Proc. IEEE, pp. 492–493, Mar. 1977.
On Airborne Wave Tilt Measurement, by King, R. J., Radio Science, vol. 12(3), pp. 405–414, May-Jun. 1977.
Antenna Measurements,–1978, by Kummer, W. H., et al., Proc. IEEE, vol. 66(4), pp. 483–507, Apr. 1978.
Measurement of Aircraft–Antenna Patterns Using Models, By Sinclair, G., Proceedings of the IRE, Dec. 1947, pp. 1451–1462.

*Primary Examiner*—Jin F. Ng
*Assistant Examiner*—Tommy P. Chin
*Attorney, Agent, or Firm*—Isaksen, Lathrop, Esch, Hart & Clark

[57] ABSTRACT

A microwave signal is transmitted from a transmitting antenna through a transfer medium to an electrically modulated and mechanically spun microwave scatterer. The scatterer may include an electric field responsive antenna, such as a dipole, for measurement of the electric field, or a magnetic field responsive antenna, such as a loop, for measurement of the magnetic field. An impedance within the scatterer is electrically modulated at an audio frequency, and the scatterer is mechanically spun at an angular frequency substantially below that at which it is electrically modulated. The scatterer thereby re-radiates to a receiving antenna a signal at the microwave source frequency which is modulated at both the frequency of electrical modulation and the mechanical spinning frequency of the scatterer. Signals from the microwave source and from the receiving antenna are combined to yield an output signal having a magnitude which is a function of the magnitude of the field received by the scatterer and which is phase shifted proportional to the phase shift of the microwave signal from the transmitting antenna to the scatterer and thence to the receiving antenna. The output signal may be compared with a signal coherent with the frequency of rotation of the scatterer to determine the tilt angle of the electric or magnetic field received by the scatterer.

10 Claims, 9 Drawing Figures

METHOD FOR MEASURING MICROWAVE ELECTROMAGNETIC FIELDS

REFERENCE TO RELATED APPLICATION

This is a continuation of co-pending application Ser. No. 958,189, filed Nov. 6, 1978 now U.S. Pat. No. 4,195,262.

BACKGROUND OF THE INVENTION

1. Field of the Invention

This invention pertains generally to the field of electromagnetic field measurements and more particularly to apparatus for measuring electromagnetic fields using modulated scatterers.

2. Description of the Prior Art

Measurement of the characteristics of the radiated field from the antenna is of practical importance in antenna design, as well as for other purposes including the determination of the characteristics of the medium through which the radiated wave passes. Numerous techniques have been developed to obtain the desired radiated field measurements. See, e.g. W. H. Kummer, et al., "Antenna Measurements--1978," Proceedings of the IEEE, Vol. 66, No. 4, April, 1978. Using transform techniques and computers, it is possible to measure the near-field of an antenna aperture, and predict the far-field with substantial precision. Such measurement techniques eliminate the need for large antenna testing ranges or large anechoic chambers, and allow antennas in the field to be tested quickly after installation.

A common current technique of measuring field distributions involves the use of two mutually orthogonal polarized antennas. The output of each antenna is alternatively switched and each is measured in time sequence using a single radio frequency receiver. Several problems are encountered when using this technique, including the difficulty of completely uncoupling and balancing the two antennas. The radio frequency signals received by the two antennas must be transmitted via waveguides or coaxial cables to a synchronous switch connected to a radio frequency receiver. This additional equipment can affect the field being measured. Generally, the orthogonal antennas can only measure the orthogonal components of the electric field. While this may be sufficient in some applications, if the tilt of the polarization ellipse and the ratio of the major axis to minor axis is desired, then the data must be further processed by a computer.

Electric field distributions have been measured utilizing the back scattered signal from a modulated electric dipole or a spun dipole. However, previous techniques for making such field measurements have not been able to simultaneously determine, in real-time, the magnitude, phase shift, and polarization of the electric or magnetic field at the scatterer.

SUMMARY OF THE INVENTION

The apparatus in accordance with the invention includes a transmitting antenna which receives a microwave signal from a microwave source and transmits it through a medium to a modulated scatterer. The scatterer receives the microwave signal and re-radiates a signal back to a receiving antenna, which in a monostatic system is the transmitting antenna. The scatterer may consist of an electric field responsive antenna (e.g., a dipole) for measurement of the electric field component, or a magnetic field responsive antenna (e.g., a loop) for measurement of the magnetic field component. In either case, the scatterer includes a modulatable impedance which is modulated by an electrical signal at a frequency substantially below the microwave signal frequency. The scatterer is also mechanically spun about an axis at an angular frequency substantially lower than that at which its impedance is modulated. The signal that is radiated from the scatterer thus will be modulated at the audio frequency at which its impedance is modulated and at the frequency at which it is spun.

The signal that is received from the scatterer is combined with a signal from the microwave source and thereafter demodulated to yield an output signal which is at the frequency at which the scatterer impedance is modulated, and which is phase shifted proportional to the phase shift of the microwave signal received by the receiving antenna. The output signal has a magnitude which is a function of the magnitude of either the electric or magnetic field received by the scatterer and is further independent of the phase shift of the received signal.

Means are also provided for comparing the phase of the output signal with the phase of a signal which is coherent with the frequency of the electrical signal modulating the scatterer impedance. By comparing the phase of the two signals, the phase shift of the microwave signal from the transmitting antenna to the scatterer and back to the receiving antenna can thereby be measured.

In addition, means are further provided for comparing the envelope of the output signal with a signal which is coherent with the frequency of spinning of the scatterer, to allow measurement of the tilt angle of the major axis of the electric or magnetic field received by the scatterer. The extent to which the major axis is tilted can be determined because the dipole or loop progressively passes into and out of alignment with the major and minor axes of the field, resulting in a variation of the magnitude of the detected output signal as a function of angular position of the scatterer. By comparing the angular position of the scatterer over time with the maximum or minimum of the envelope of the detected output signal, it is possible to determine the direction of polarization relative to some arbitrary reference. It is also possible to measure polarization properties by observing the change in phase shift as a function of scatterer angular position over time.

The apparatus of the invention provides substantially continuous output signals indicative of the field characteristics. The output signal information may be read from an oscilloscope in real time by an operator, or the information may be stored and placed in a form suitable for further processing by computer. In either case, because the information on the field characteristics are compiled continuously, the scatterer can be quite readily moved about in space to measure the field characteristics at various positions. Complete measurement of the field radiated from an antenna thus can be obtained very quickly in comparison with present methods. The apparatus of the invention can also be utilized to obtain information about the characteristics of materials through which the microwave signal passes, since the characteristics of the material may affect the attenuation of the microwave signal as well as its phase shift and depolarization.

DESCRIPTION OF THE PREFERRED EMBODIMENTS

Figure 1:
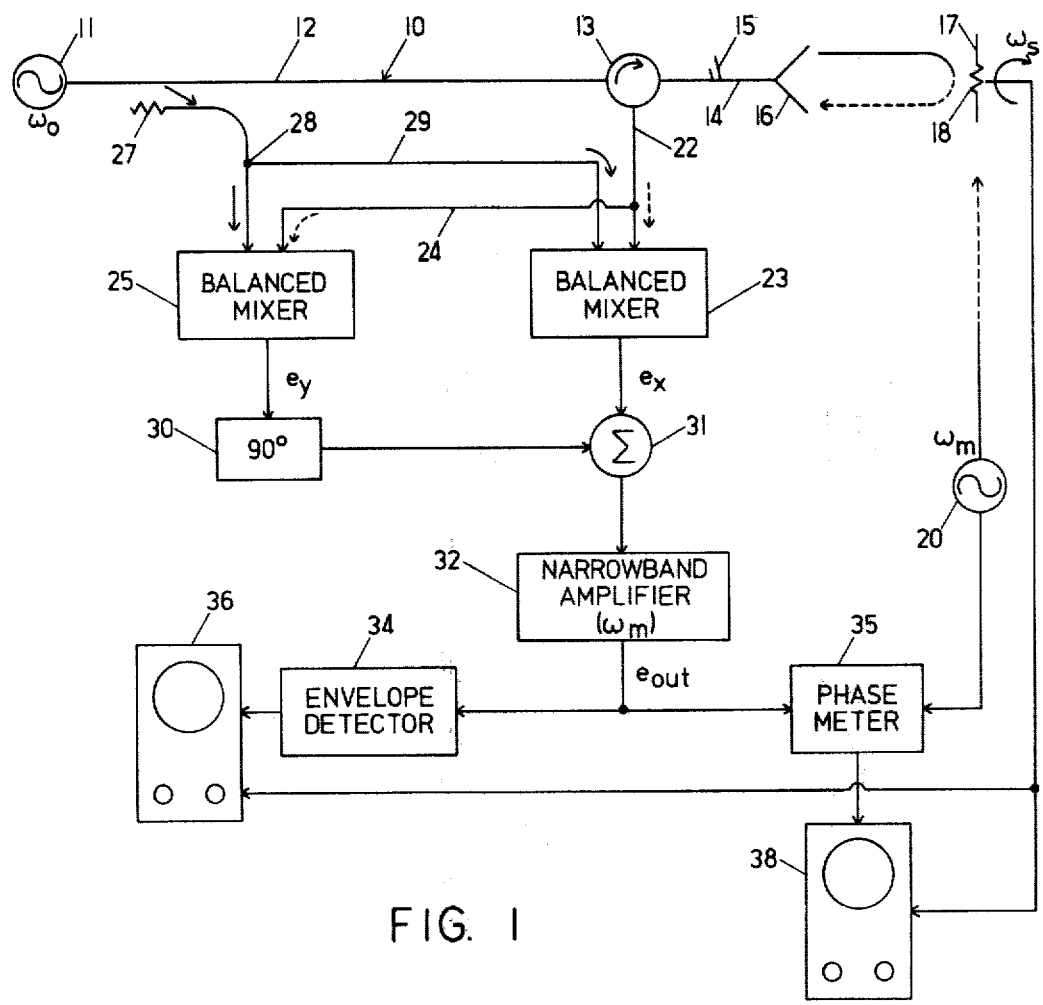
FIG. 1 is a schematic view of monostatic measurement apparatus in accordance with the inventin having a single antenna which transmits and receives microwave radiation.

With reference to the drawings, wherein the numerals refer to like parts in each view, a monostatic apparatus for measuring microwave electromagnetic fields in accordance with the invention is shown generally at 10 in FIG. 1. The apparatus includes a microwave signal source 11 which transmits the microwave signal through a wave guide 12 to a circulator 13. The signal is transmitted through the circulator in this monostatic system through a wave guide portion 14, which includes a tuner shown schematically at 15, to a transmitting antenna 16. The microwaves radiated from the antenna 16 pass through the transmission medium to a dipole scatterer 17 having a modulatable impedance 18 connected in the middle of the dipole. In the following description, the invention will be illustrated with reference to a dipole antenna for measurement of the electric field component, and a loop for measurement of the magnetic field component. It is apparent that more complex antenna structures could be utilized which are selectively responsive to either the electric or the magnetic field component of the radiated wave.

An electrical signal from a signal source 20 at a frequency $\omega_m$ is provided to the modulatable impedance 18 to vary its effective impedance at the frequency $\omega_m$.

The frequency of impedance modulation is chosen to be substantially less than the microwave frequency to allow adequate modulation, preferably being at least a ratio of 10 to 1 less than the frequency of the microwave source. Generally, good results are obtainable when the frequency $\omega_m$ is in the high audible range, e.g. 15 to 20 kHz. The scatterer 17 is also mechanically spun about an axis of rotation through its center at an angular frequency $\omega_s$ which is substantially less than the frequency $\omega_m$ at which the dipole impedance is modulated, that is, at least by a factor of 10 to 1 less.

The dipole scatterer 17 receives energy from the electric field portion of the microwave signal and reradiates a microwave signal at the same frequency back to the transmitting antenna 16. However, the signal that is radiated or "scattered" from the scatterer 17 is modulated first at the frequency $\omega_m$ at which the internal impedance 18 of the dipole is modulated, and secondly at twice the angular frequency $\omega_s$ at which the dipole is spun. Modulation at this second frequency occurs because, as the dipole rotates, it progressively passes into and out of alignment with the axis of polarization of the electric field. Unless the electic field is perfectly circularly polarized, the magnitude of the electric field seen by the dipole will pass from a maximum to a minimum and back to a maximum again twice during each rotation of the dipole.

The signal from the dipole 17 which is received by the antenna 16 is transmitted through the circulator 13 to a wave guide 22 and then is equally split for transmission to a first balanced mixer 23 and through a wave guide 24 to a second balanced mixer 25. The microwave signal from the source 11 is transmitted through a directional coupler 27 to a 3 dB 90° hybrid junction 28. The junction 28 splits the reference signal and transmits the reference signal phase shifted by 90° to the second balanced mixer and also transmits the reference signal without phase shift through a wave guide 29 to the first balanced mixer 23. The output of the second balanced mixer 25 is passed through a 90° phase shifter 30 to an adder 31 wherein it is summed with the output signal of the first balanced mixer 23. The output of the adder is passed to a narrow band amplifier 32 having a pass band centered at the dipole impedance modulation frequency $\omega_m$ to filter out noise and extraneous information signals. Since the magnitude of the output of the adder will be modulated at twice the frequency $\omega_s$ at which the dipole is spun, it is preferred that the band width of the amplifier be at least 4 $\omega_s$.

The output of the narrow band amplifier 32 is directed to an envelope detector 34 and a phase meter 35. The phase meter 35 also receives for comparison the dipole impedance modulating signal at the frequency $\omega_m$ from the modulating signal source 20. The output of the envelope detector may be connected to any suitable read-out device or to signal processing circuitry (not shown) for further operations on the data. Real-time monitoring of the output may be provided by connecting the output of the envelope detector to an oscilloscope 36. The wave forms seen on the oscilloscope, as explained below, will be a time varying signal whose maximums and minimums correspond to the alignment of the dipole with the major and minor axes respectively of the radiated electric field.

The output of the phase meter 35 is a time varying signal proportional to the phase shift between the dipole impedance modulation reference signal and the phase of the output signal from the narrow band amplifier 32.

The output of the narrowband amplifier will be at the same frequency $\omega_m$ as the modulation signal, but will be phase shifted proportional to the phase shift of the microwave signal passing from the antenna to the scatterer and back again. Real-time monitoring of the output of the phase meter may be obtained by providing the output signal to an oscilloscope 38 for viewing by the operator.

To obtain the depolarization of the wave from the antenna to the scatterer and back again, it is necessary to compare the output signal from either the envelope detector or the phase meter with a signal at the frequency of rotation $\omega_s$ of the scatterer. This signal can be obtained in various ways, as explained below, and can be fed to the oscilloscopes 36 and 38 to allow triggering of the oscilloscopes at selected points on the wave form of the signal at the $\omega_s$ frequency. The scatterer rotation frequency signal may also be recorded in time synchrony with the outputs of the envelope detector or of the phase meter, and may be further processed by data processing equipment (not shown) using conventional programing techniques to yield a permanent read-out of data concerning the field at the various points at which the scatterer is positioned.

Figure 3:
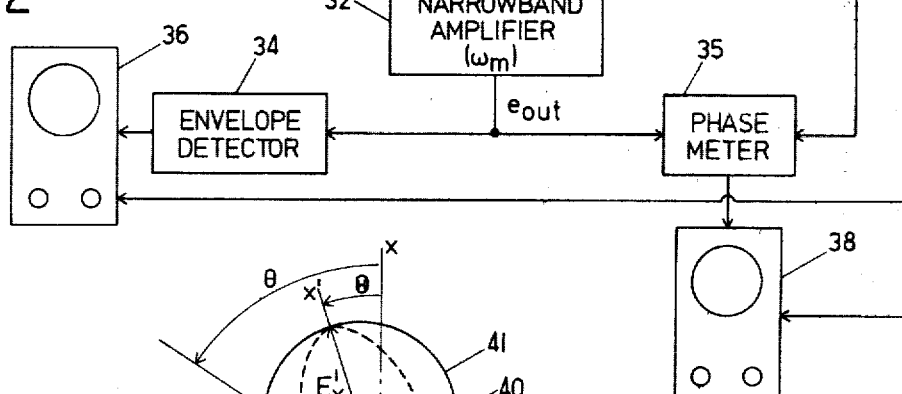
FIG. 3 is an illustrative pictorial representation of a typical shape of the electric field at the scatterer.
Figure 4:
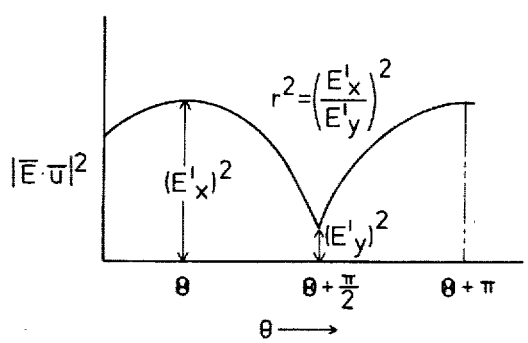
FIG. 4 is an illustrative pictorial representation of the magnitude of the detected output signal as a function of the angular position of the scatterer, which is proportional to the square of the magnitude of the electric field at the scatterer.
Figure 5:
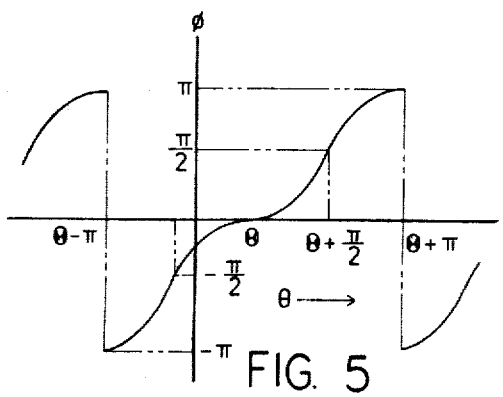
FIG. 5 is a similar pictorial representation of the measured phase shift of the microwave signal as a function of the angular position of the scatterer.

The operation of the apparatus of FIG. 1 is best explained with reference to the graphic diagrams of FIGS. 3-5. FIG. 3 is a typical representation of the locus of the instantaneous electric field at an angle $\theta$ and overlayed locus of the RMS field at the same angle, with these shapes being chosen arbitrarily for illustrative purposes. FIG. 4 is a graph of the output of the envelope detector as a function of $\theta$ over time, and FIG. 5 is a similar graph of the phase shift $\phi$ over time as a function of $\theta$. These output signals are obtained using the phase insensitive coherent detector arrangement shown in FIG. 1. This circuitry is also know as a single side-band suppressed carrier demodulator, since it has the form of a single side-band suppressed carrier quadrature type modulator. Such circuits have also been utilized as image rejection mixers in superheterodyne systems.

To facilitate an understanding this system, it may be first assumed that the scatterer 18 is only electrically modulated at a frequency $\omega_m$ and is not spun. In this case, it can be shown that output signal $e_x$ from the first balanced mixer 23 is of the form $$e_x = \begin{Bmatrix} K_1 A \\ K_h \end{Bmatrix} b \cos(2\phi) \cos(\omega_m t)$$

and that the output signal $e_y$ of the second balanced mixer 25 is of the form $$e_y = \begin{Bmatrix} K_1 A \\ K_h \end{Bmatrix} b \sin(2\phi) \cos(\omega_m t)$$

In the foregoing expressions, A is the amplitude of the reference signals at the microwave frquency fed through the junction 28 to the mixers, and b is the amplitude of the signal at the mixers received back from the scatterer through the antenna 16. It is assumed that A is much larger than b, e.g., 30 dB or more. The amplitude factor (conversion gain) $K_1 A$ is used where the mixer is operating in its square law region for low level signals, and the constant $K_h$ is used for high level signals where the mixers are operating as linear rectifiers.

The output of the adder 31 will be proportional to the following expression:

$$\begin{Bmatrix} K_1 A \\ K_h \end{Bmatrix} |\bar{E} \cdot \bar{u}_1|^2 \cos(\omega_m t - 2\phi)$$

where E is the vector electric field received by the scatterer and $u_1$ is the unit vector along the scatterer. $\phi$ is the phase shift of the microwave signal from the antenna to the scatterer. Thus, when the output of the adder 31 has passed through the narrow band amplifier 32, the output signal will be centered at a frequency $\omega_m$, will have a magnitude proportional to the square of the magnitude of the electric field along the scatterer, and will be phase shifted by twice the phase shift of the microwave signal from the antenna to the scatterer. If the scatterer is stationary, the output of the envelope detector 34 will be a constant signal proportional to $|\bar{E} \cdot \bar{u}_1|^2$, and the output of the phase meter will be a constant signal proportional to $2\phi$.

It should be apparent to those skilled in the art that the relative phase shift between the two outputs of the 3 dB hybrid coupler 28 could be plus or minus 90°. Similarly, the phase shifter 30 could shift the signal passing through it at frequency $\omega_m$ by plus or minus 90°, and the adder 31 could equally serve to subtract its two inputs. In all of these several possibilities, the signal at the input of the narrowband amplifier 32 is of the form $$\pm \begin{Bmatrix} K_1 A \\ K_h \end{Bmatrix} |\bar{E} \cdot \bar{u}_1|^2 \begin{Bmatrix} \cos(\omega_m t \pm 2\phi) \\ \sin(\omega_m t \pm 2\phi) \end{Bmatrix}$$

It is therefore seen that the essential features of the system are retained, regardless of whether the phase is shifted by plus or minus 90° in junction 28 or phase shifter 30, whether they are associated with the first or second balanced mixers, or whether device 31 is an adder or subtractor.

Figure 8:
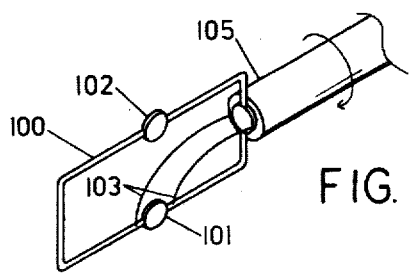
FIG. 8 is a somewhat simplified view of a loop scatterer device utilized for measuring the magnetic field components of microwave radiation.

Since the dipole scatterer 17 is in fact being spun at a frequency $\omega_s$, the magnitude of the output of the envelope detector will vary at a frequency of twice $\omega_s$. The output of the phase meter will also vary over time with a cycle repeating at a frequency of $2\omega_s$. Although the locus of the instantaneous electric field is elliptical, as shown by the line labeled 40 in FIG. 3, it is actually the mean square of the field which is being measured, i.e. $|E \cdot u_1|^2$. The RMS electric field magnitude has somewhat of a figure 8 pattern, as shown by the line 41 in FIG. 3, consisting of two intersecting circles in which the ellipse is inscribed. The field seen by the scatterer will be maximum when the angle of the dipole $\theta$ is equal to the tilt of the major axis of the electric field at the angle $\Theta$ from the X axis, and a relatively sharp minimum in the RMS field will occur when the dipole angle aligns with the minor axis of the electric field at the field angle $\Theta$ plus or minus $\pi/2$. Either the maximum or the minimum of the means square field can be used to establish the tilt angle $\Theta$, although it is apparent that since the minimum is relatively sharp, it is easier to use the minimum value. The ratio of $E_x/E_y$ is the ratio of the field at the major axis to the field at the minor axis of an elliptically polarized field.

A means for determining the tilt angle Θ of the major axis of the polarization ellipse is obtained by comparison of the output signal with a signal at frequency $\omega_s$ from the device that mechanically spins the scatterer. The signal should be coherent with the frequency of rotation of the scatterer, that is, bear a fixed phase relationship. Where a synchronous motor is utilized, the line voltage signal can be brought to the read-out oscilloscope 36 and compared in time synchrony with the signal from the envelope detector 34, for example by using a dual trace oscilloscope or by using line voltage to trigger the oscilloscope. Alternatively, the signal at the dipole rotation frequency may be brought to the phase reading oscilloscope 38 and compared with the output of the phase meter, which is shown illustratively in FIG. 5, to determine the tilt angle Θ. In the graphical views of both FIGS. 4 and 5, the angle $\theta$ of the dipole with respect to a chosen x axis is equal to $\omega_s t$, where t is time.

Figure 2:
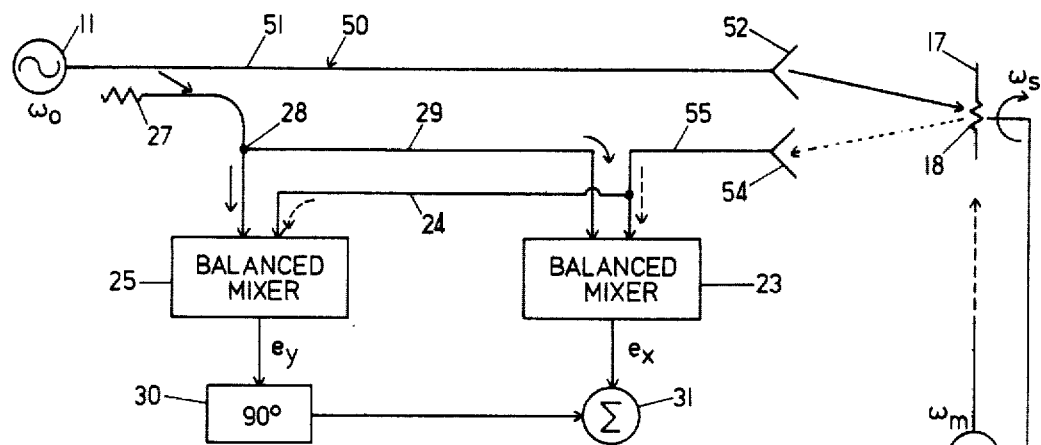
FIG. 2 is a schematic view of bistable measurement apparatus in accordance with the invention wherein one antenna is provided for transmitting a microwave signal and a second antenna is provided for receiving a scattered microwave signal.

A bistatic apparatus for performing the electric field measurements described above is shown generally at 50 in FIG. 2. The bistatic apparatus 50 is substantially identical to the monostatic apparatus 10 except that the microwave signal source 11 delivers the microwave signal directly through a wave guide 51 to a transmitting antenna 52, and the microwave signal from the scatterer 17 is received by a separate receiving antenna 54. The receiving antenna 54 is connected to a wave guide 55 which delivers the received signal to the balanced mixers 23 and 25. In all other respects the circuit is identical to that shown in FIG. 1 and functions in the same manner.

Figure 6:
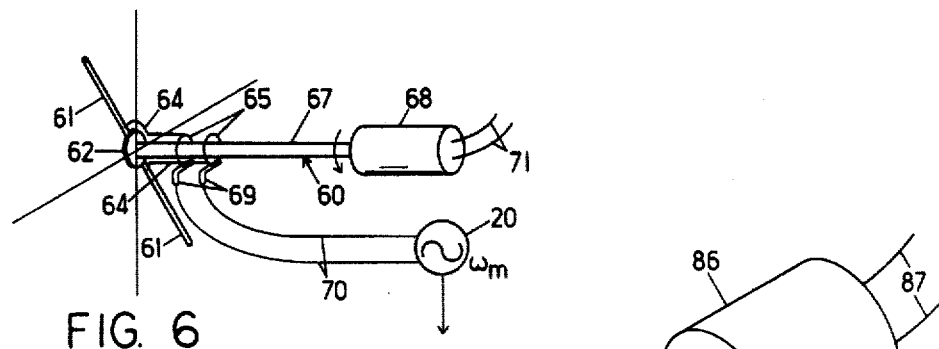
FIG. 6 is a somewhat simplified view of a dipole scatterer which is rotated by an electric motor and has slip rings for transmitting the electrical modulation signal to the dipole.

A first scattering probe structure for providing a spinning dipole and the required reference signals is shown generally at 60 in FIG. 6. The probe 60 includes dipole arms 61 composed of conductive metal leads and a diode rectifier 62 (preferably a microwave PIN diode) electrically connected between the two dipole arms. To provide modulation to the diode 62, electrically conductive wire leads 64 are connected to the dipole arms on either side of the diode and extend back a short distance to slip rings 65. The slip rings are mounted around a central shaft 67 to which the dipole is centrally mounted. The shaft 67, which is preferably made of a microwave transparent material, extends back to a synchronous electric motor 68. The slip rings made contact with brushes 69 connected by electrical leads 70 to the signal generator 20 which provides the modulating electrical signal at the frequency $\omega_m$. Power lines 71 extend from the motor 68 to a source of AC power, with the power line frequency then being utilized as the reference frequency $\omega_s$ for comparison purposes in the readout oscilloscopes 36 and 38. The leads 64 which extend from the slip rings 65 to the diode are preferably fine magnet wire insulated with enamel. To avoid disturbing the field, it is desirable that these leads be oriented normal to the electric field. Alternatively, high resistance leads which are essentially transparent to radio frequency waves can be used. The motor 65, its supports, and the shaft 67 are preferably covered with microwave absorber material (not shown) to reduce their influence on the field to the maximum extent possible.

Figure 7:
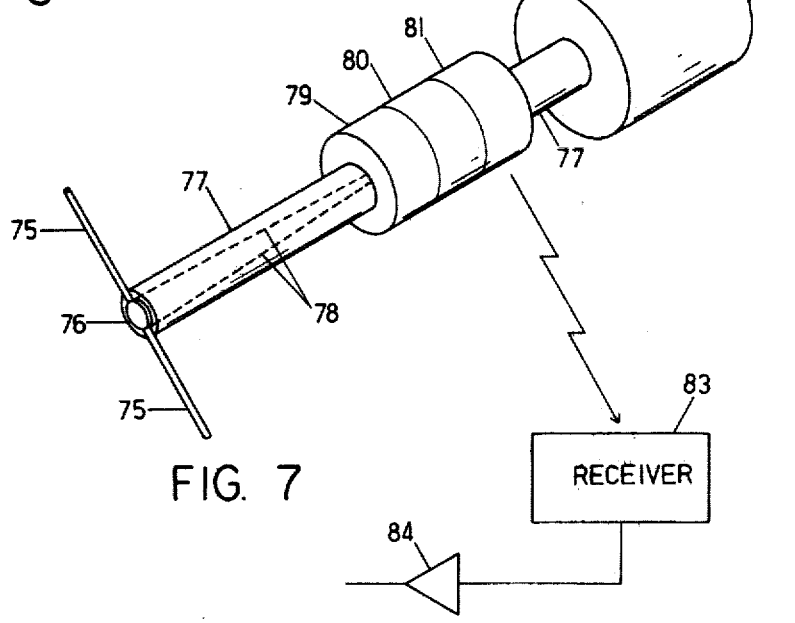
FIG. 7 is a somewhat simplified view of another device for rotating a dipole scatterer utilizing an electric motor and a radio frequency transmitter for broadcasting the dipole modulating signal.

It is noted that the modulating oscillator which provides the modulating frequency $\omega_m$ can be designed and built as an integral part of the shaft 67. Slip rings may be utilized to provide the $\omega_m$ frequency reference signal to the measurement circuitry. Alternatively, a radio frequency transmitter can be utilized to transmit this signal. An example of such a scattering probe is shown in FIG. 7. This device inlcudes a dipole 75, a centrally connected diode 76 between the arms of the dipole, a shaft 77 to which the dipole is centrally mounted, and a pair of electrical leads 78 connected on either side of the diode running back through the shaft to the $\omega_m$ frequency oscillator 79. The oscillator 79 is mounted to the shaft and rotates with it. Likewise mounted on the shaft are a DC supply battery 80 and a radio frequency transmitter 81 which transmits a high frequency radio signal modulated at the modulating frequency $\omega_m$ to a remote receiver 83. The receiver 83 detects the $\omega_m$ frequency signal and provides it through an isolation amplifier 84 to the phase meter 35. The shaft 77 is rotated by an electric motor 86 which is synchronously driven from AC electric power lines 87.

Figure 9:
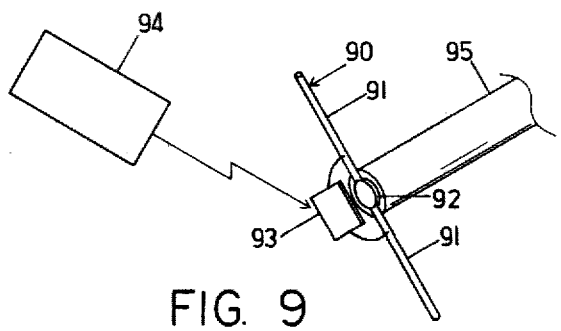
FIG. 9 is another diopole scatterer in which the modulatable impedance includes a photocell which is provided with a source of chopped light which impinges upon and modulates the photocell.

Another means for modulating the impedance of the device is shown in FIG. 9, wherein a diode 90 has its conducting arms 91 electrically connected together by a diode 92. A photocell 93 is electrically connected around the diode 92 and receives on its face chopped light from a source of high frequency chopped light 94. The light source 94 provides light at a frequency $\omega_m$. The dipole is mounted to a shaft 95 which is itself connected to a motor (not shown) for rotation.

It is apparent that a number of other techniques can be utilized to supply the modulation reference frequency signal at frequency $\omega_m$ and the dipole spinning frequency signal at frequency $\omega_s$. For example, the $\omega_s$ spinning frequency signal would be provided by mounting various devices such as tachometers or synchro transformers to the output shaft, or by using simple switch contacts or optical detectors on the rotating shaft which provides an electrical signal each time the spinning dipole completes a revolution.

The foregoing diode scatterer is utilized to measure the electric field component of microwave radiation. As indicated above, a more complex antenna can be used which responds to a single electric field component. In an entirely analogous manner, the magnetic field component of the wave can be measured utilizing an antenna selectively responsive to the magnetic field components such as the loop shown in FIG. 8 at 100. The loop 100 contains at least one modulatable impedance therein such as the diode 101. For purposes of properly electrically balancing the loop, it is desired that a second diode 102 be placed in the opposite leg of the loop 100. Highly resistive electrical leads 103 are connected to the loop on either side of one of the diodes and extend back through a rotating shaft 105 which is centrally mounted to one end of the loop. The electrical leads 103 provide an electrical signal which essentially modulates the impedance of the diode 101 at the modulating frequency $\omega_m$. The shaft is rotated at the spinning frequency $\omega_s$. The phase insensitive detection circuits of FIGS. 1 and 2 may be utilized to detect the signal that is scattered from the loop 100, and the outputs that are obtained from the envelope detector 34 and phase meter 35 are entirely analogous to those described above for measurement of the field. In particular, the relative magnitude of the magnetic field H along its major and minor axes, the tilt of the polarization ellipse, and the relative phase shift of the field are detected in the same manner as described above for the electric field. The various devices described above for obtaining the reference signals at frequency $\omega_m$ and frequency $\omega_s$ can also be utilized in entirely the same manner for measurement of the magnetic field component by the loop 100.

The operation of the scatterers can be optimized using various known techniques for maximizing the scattering cross-section. For example, the dipole can be made resonant, as by making its electrical length nearly equal to $\lambda/2$, where $\lambda$ is the wave length of the ratio frequency field being measured. The result is a self-resonant scatterer. Other techniques can be utilized, such as making the dipole arms in a zig-zag configuration fabricated on a printed circuit board, or the use of helical arms. Below about 5 giga-hertz, the scattering cross-section of a short dipole can be made nearly as large as that of a self-resonant dipole by adding extra inductance to make it resonant. This can be easily accomplished by adding a turn or two of wire or a ferrite bead to each dipole arm. It is also possible to increase scattering cross-sections using negative resistance type loads, such as by using transfer electron semiconductors, Gunn, IMPATT or tunnel diodes.

The measurement of the magnetic field is normally done with the loop oriented such that its axis of rotation is normal to the magnetic field, and the diodes in the two sides of the loop are perpendicular to the electric field. If electrical modulation of the diodes is to be done via leads, the leads should also preferably be oriented perpendicular to the electric field. In order to minimize the effect of the leads on the electric field, highly resistive leads are preferred. The loop can be made self-resonant by making its circumference slightly greater than $\lambda$, the wave length of the microwave signal. Smaller resonant loops can be built by using several turns, or by adding capacitance. The loop can also be loaded with negative resistance diodes to make it active.

It is understood that the invention is not confined to the particular construction or arrangement of parts herein illustrated and described, but embraces all such modified forms thereof as come within the scope of the following claims.

I claim:

1. A method of measuring the microwave field radiated from an antenna, comprising the steps of:
   (a) radiating microwaves from a transmitting antenna;
   (b) spinning a scattering antenna in the radiated field from the transmitting antenna with the scattering antenna being provided with a modulatable impedance electrically connected therein and being selectively responsive to the electric field component of the radiated microwave field;
   (c) simultaneously modulating the impedance in the scattering antenna at a frequency substantially greater than the angular frequency at which the scattering antenna is spun;
   (d) receiving the microwave radiation signal reradiated from the scattering antenna;
   (e) combining and demodulating the microwave signal from the scattering antenna with a microwave signal being radiated from the transmitting antenna to yield an output signal at the frequency at which the scattering antenna impedance is modulated and phase shifted proportional to the phase shift of the microwave signal received from the scattering antenna, and with a magnitude which is independent of such phase shift and a function of the magnitude of the electric field received by the scattering antenna;
   (f) comparing a signal at a frequency coherent with the frequency of spinning of the scattering antenna with the output signal at the frequency at which the scattering antenna impedance is modulated to allow the measurement of the relative tilt angle of the major axis of the microwave electric field received by the scattering antenna.

2. A method of measuring the microwave field radiated from an antenna, comprising the steps of:
   (a) radiating microwaves from a transmitting antenna;
   (b) spinning a scattering antenna in the radiated field from the transmitting antenna with the scattering antenna being provided with a modulatable impedance electrically connected therein and being selectively responsive to the magnetic field component of the radiated microwave field;
   (c) simultaneously modulating the impedance in the scattering antenna at a frequency substantially greater than the angular frequency at which the scattering antenna is spun;
   (d) receiving the microwave radiation signal reradiated from the scattering antenna;
   (e) combining and demodulating the microwave signal from the scattering antenna with a microwave signal being radiated from the transmitting antenna to yield an output signal at the frequency at which the scattering antenna impedance is modulated and phase shifted proportional to the phase shift of the microwave signal received from the scattering antenna, and with a magnitude which is independent of such phase shift and a function of the magnitude of the magnetic field received by the scattering antenna;
   (f) comparing a signal at a frequency coherent with the frequency of spinning of the scattering antenna with the output signal at the frequency at which the scattering antenna is modulated to allow measurement of the relative tilt angle of the major axis of the microwave magnetic field received by the scattering antenna.

3. A method of measuring the effect of materials on the microwave field radiated from an antenna, comprising the steps of:
   (a) radiating microwaves from a transmitting antenna;
   (b) spinning a scattering antenna in the radiated field from the transmitting antenna with the scattering antenna being provided with a modulatable impedance electrically connected therein and being selectively responsive to the electric field component of the radiated microwave field;
   (c) simultaneously modulating the impedance in the scattering antenna at a frequency substantially greater than the angular frequency at which the scattering antenna is spun;
   (d) receiving the microwave radiation signal reradiated from the scattering antenna;
   (e) combining and demodulating the microwave signal from the scattering antenna with a microwave signal being radiated from the transmitting antenna to yield an output signal at the frequency at which the scattering antenna impedance is modulated and phase shifted proportional to the phase shift of the microwave signal received from the scattering antenna, and with a magnitude which is independent of such phase shift and a function of the magnitude of the electric field received by the scattering antenna;
   (f) comparing a signal at a frequency coherent with the frequency of spinning of the scattering antenna with the output signal at the frequency at which the scattering antenna impedance is modulated to allow measurement of the relative tilt angle of the major axis of the microwave electric field received by the scattering antenna, and (g) inserting a material to be tested in the microwave field radiated from the transmitting antenna and repeating steps (b) through (f) to thereby allow the effect of the tested material on the microwave field to be determined.

4. A method of measuring the effect of materials on the microwave field radiated from an antenna, comprising the steps of:

(a) radiating microwaves from a transmitting antenna;

(b) spinning a scattering antenna in the radiated field from the transmitting antenna with the scattering antenna being provided with a modulatable impedance electrically connected therein and being selectively responsive to the magnetic field component of the radiated microwave field;

(c) simultaneously modulating the impedance in the scattering antenna at a frequency substantially greater than the angular frequency at which the scattering antenna is spun;

(d) receiving the microwave radiation signal reradiated from the scattering antenna;

(e) combining and demodulating the microwave signal from the scattering antenna with a microwave signal being radiated from the transmitting antenna to yield an output signal at the frequency at which the scattering antenna impedance is modulated and phase shifted proportional to the phase shift of the microwave signal received from the scattering antenna, and with a magnitude which is independent of such phase shift and a function of the magnitude of the magnetic field received by the scattering antenna;

(f) comparing a signal at a frequency coherent with the frequency of spinning of the scattering antenna with the output signal at the frequency at which the scattering antenna is modulated to allow measuremnt of the relative tilt angle of the major axis of the microwave magnetic field received by the scattering antenna; and (g) inserting a material to be tested in the microwave field radiated from the transmitting antenna and repeating steps (b) through (f) to thereby allow the effect of the tested material on the microwave field to be determind.

5. The method of claim 1, 2, 3 or 4 further including the step of:

comparing the pahse of the output signal at the frequency at which the scattering antenna impedance is modulated with a signal coherent with the frequency at which the scattering antenna impedance is modulated to allow measurement of the phase shift of the microwave signal from the transmitting antenna to the scattering antenna and back again.

6. The method of claim 1, 2, 3 or 4 further including the step of detecting the envelope of the output signal at the frequency at which the scattering antenna impedance is modulated to provide a signal proportion to the magnitude of the microwave field component received by the scattering antenna.

7. The method of claim 1 or 3 wherein the scattering antenna is an electric dipole.

8. The method of claim 2 or 4 wherein the scattering antenna is a loop of electrical conductor.

9. The method of claim 1, 2, 3 or 4 wherein the step of comparing a signal at a frequency coherent with the frequency of spinning of the scattering antenna to measure the relative tilt angle includes the steps of:

(1) detecting the envelop of the magnitude of the output signal at the frequency at which the scattering antenna impedance is modulated, (2) comparing the envelope of the magnitude of the output signal with the signal at a frequency coherent with the frequency of spinning of the scattering antenna.

10. The method of claim 1, 2, 3 or 4 wherein the step of combining and demodulating the microwave signal from the scattering antenna with a microwave signal radiated from the transmitting antenna includes the steps of:

(1) mixing a microwave signal as radiated from the transmitting antenna with the microwave signal received from the scattering antenna to provide a first mixed output signal, (2) phase shifting a microwave signal as radiated from the transmitting antenna by 90°, (3) mixing the microwave signal phase shifted by 90° with a microwave signal received from the scattering antenna to produce a second mixed output signal, (4) phase shifting by 90° the second mixed output signal, (5) adding the first mixed output signal with the phase shifted second mixed output signal, (6) passing the added output signals through a narrowband amplifier centered at the impedance modulation frequency to amplify the added mixed output signal.

* * * * *